United States Patent [19]
Kubota et al.

[11] Patent Number: 5,691,088
[45] Date of Patent: Nov. 25, 1997

[54] PELLICLE FOR PROTECTION OF PHOTOLITHOGRAPHIC MASK

[75] Inventors: Yoshihiro Kubota; Meguru Kashida; Yoshihiko Nagata; Hitoshi Noguchi; Yuichi Hamada; Kimitaka Kumagae, all of Gunma-ken, Japan

[73] Assignee: Shin-Etsu Chemical Co., Ltd., Tokto, Japan

[21] Appl. No.: 949,389

[22] Filed: Sep. 22, 1992

[30] Foreign Application Priority Data

Sep. 26, 1991 [JP] Japan .................................. 3-274564

[51] Int. Cl.$^6$ ...................................... G03F 9/00
[52] U.S. Cl. ..................... 430/5; 428/45; 428/343; 428/355
[58] Field of Search ................. 430/5; 428/45, 428/343, 355

[56] References Cited

U.S. PATENT DOCUMENTS

| | | | |
|---|---|---|---|
| 4,996,106 | 2/1991 | Nakagawa et al. | 428/343 |
| 5,095,085 | 3/1992 | Hara et al. | 528/15 |

*Primary Examiner*—Mark Chapman
*Attorney, Agent, or Firm*—McAulay Fisher Nissen Goldberg & Kiel, LLP

[57] ABSTRACT

Disclosed is a frame-supported pellicle for dust-proofing of a photolithographic photomask used for patteriwse light exposure in the manufacturing process of, for example, semiconductor devices, which comprises (a) a frame member, (b) a transparent polymeric film supported by the frame member and (c) a coating layer of a sticky adhesive on one surface of the polymeric film to capture any dust particles in the space between the photomask and the pellicle. The inventive pellicle is imparted with a greatly improved serviceable life with stability against ultraviolet irradiation relative to the adhesive coating layer which is formed from a specific organo-polysiloxane-based adhesive composition.

4 Claims, 1 Drawing Sheet

FIGURE
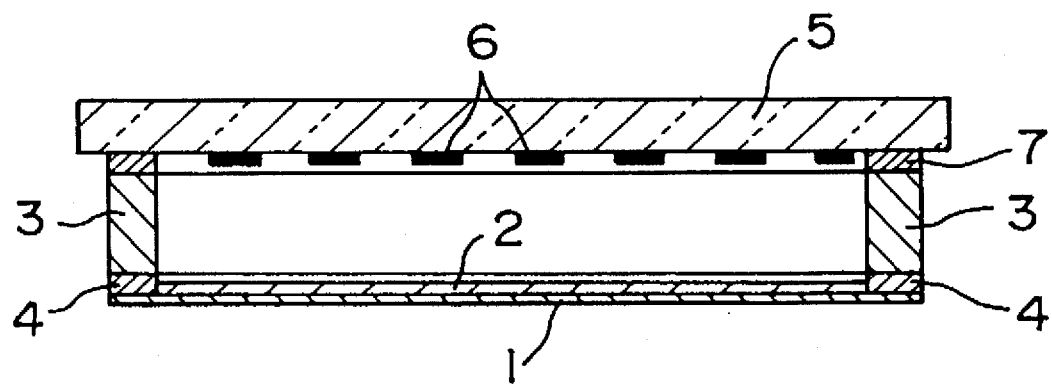

PELLICLE FOR PROTECTION OF PHOTOLITHOGRAPHIC MASK

BACKGROUND OF THE INVENTION

The present invention relates to a pellicle used for protection of a photomask in photolithographic patterning in the manufacture of various kinds of electronic devices such as LSIs, VLSIs, liquid crystal display units and the like. More particularly, the invention relates to a frame-supported pellicle for dust-proofing of a photomask in photolithographic patterning works imparted with durable capturing adhesiveness of the surface to dust particles.

It is an established technology in the electronic industry that the manufacturing process of various kinds of semiconductor devices such as LSIs, VLSIs and the like as well as liquid crystal display units involves a step of photolithographic fine patterning, in which the surface of a substrate such as a semiconductor silicon wafer is exposed patternwise to light through a photomask bearing the pattern. As is readily understood, it is essential that the surface of the photomask is absolutely clean and free from any dust particles because, when a dust particle is deposited on the photomask, a detrimental effect is caused that the incident light to irradiate the substrate surface is absorbed or scattered by the dust particle so that the pattern formed by the exposure to light is deformed or blurred or subject to a decrease in the contrast leading to a decreased quality of the products.

In this regard, it is usual that the photolithographic patterning work is conducted in a clean room having a controlled cleanness in order to prevent dust deposition on the photomask. Nevertheless, photomasks can be hardly prevented from deposition of a few dust particles even in a clean room of a highest degree of cleanness. This problem is almost completely solved when the photomask is covered by a pellicle which is a thin, transparent film of a polymeric material supported by a frame to facilitate mounting on the photomask. Most conventional polymeric materials of the pellicle include, for example, cellulose derivatives such as nitrocelluloses, cellulose acetates and the like but, in view of the defects in these cellulose derivatives, proposals have been recently made for the use of polymers of trimethyl vinyl silane, pullulan and derivatives thereof, amorphous fluorocarbon polymers, silicone-modified polyvinyl alcohols and the like.

Mounting of a pellicle on a photomask is indeed effective in preventing entering of dust particles from outside. Once a frame-supported pellicle is mounted on a photomask, however, dust particles already deposited on the pellicle surface can no longer be removed out of the space and sometimes may cause a problem that the dust particles subsequently fall on the photomask to cause the above mentioned troubles.

As a countermeasure for the above mentioned problem, Japanese Patent Kokai 61-241756 proposes a method in which the inside surface of the pellicle, i.e. the surface facing the photomask, and the inner surfaces of the frame are coated with an epoxy-based sticky adhesive capable of capturing the dust particles floating in the space between the photomask and the pellicle so that the dust particles deposited on the pellicle surface and captured by the sticky adhesive layer would never be released to the space. This method, however, is not quite satisfactory due to the relatively low capturing adhesiveness of the adhesive surface to dust particles and degradation of the epoxy resin after a prolonged period of use under irradiation with ultraviolet light as the light source for the photolithographic patternwise exposure to light resulting in embrittlement of the adhesive resin to form an origin of dust particles in itself. Alternatively, Japanese Patent Kokai 1-120565 proposes the use of an acrylic-modified fluorocarbon polymer as the adhesive used in the above mentioned coating treatment. This adhesive is also not satisfactory in respect of the relatively low dust particle-capturing adhesiveness.

SUMMARY OF THE INVENTION

The present invention accordingly has an object to provide a novel and improved frame-supported pellicle having a surface coated with a sticky adhesive for capturing of dust particles used for dust-proofing of a photomask in the photolithographic patterning of a substrate material free from the above described problems and disadvantages in the conventional adhesive-coated pellicles in the prior art.

Thus, the frame-supported pellicle of the present invention comprises:

(a) a frame member;

(b) a transparent film of a polymeric material flatly supported by the frame member by adhesive bonding; and (c) a layer of a sticky adhesive on one of the surfaces of the transparent film of a polymeric material, the sticky adhesive being an organopolysiloxane composition comprising:

(A) 100 parts by weight of an organopolysiloxane resin consisting of monofunctional siloxane units expressed by the unit formula $(CH_3)_3SiO_{0.5}$ and tetravalent siloxane units expressed by the unit formula $SiO_2$ in a molar ratio in the range from 1:0.4 to 1:1.5; and (B) from 20 to 50 parts by weight of a diorganopolysiloxane represented by the general formula

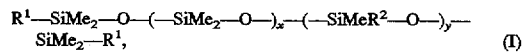

$$R^1\text{—}SiMe_2\text{—}O\text{—}(\text{—}SiMe_2\text{—}O\text{—})_x\text{—}(\text{—}SiMeR^2\text{—}O\text{—})_y\text{—}SiMe_2\text{—}R^1, \quad (I)$$

in which Me is a methyl group, $R^1$ is a hydroxy group, methyl group or vinyl group, $R^2$ is a methyl group or vinyl group, x is a positive integer and y is 0 or a positive integer with the proviso that x+y is in the range from 100 to 10,000; or a partial or complete condensation product thereof.

BRIEF DESCRIPTION OF THE DRAWING

The FIGURE is a vertical cross sectional view of a frame-supported pellicle of the present invention with a photomask mounted thereon in the dust particle-capturing test.

DETAILED DESCRIPTION OF THE PREFERRED EMBODIMENTS

As is described above, the frame-supported pellicle of the invention comprises (a) a frame member, (b) a polymeric pellicle film supported by the frame member and (c) a coating layer of a sticky adhesive on one of the surfaces of the pellicle film or the surface to face the photomask when the frame-supported pellicle is mounted on the photomask while the most characteristic feature of the inventive pellicle consists in the use of a specific organopolysiloxane composition as the sticky adhesive. This organopolysiloxane-based adhesive composition has good capturing adhesiveness to dust particles along with a high transmissivity of light for exposure and excellent resistance against irradiation with light so that the pellicle is freed from the troubles due to dust particles floating in the space between the photomask and the pellicle even after a long period of use under irradiation with ultraviolet light.

The frame-supported pellicle of the invention is schematically illustrated in the FIGURE of the accompanying drawing by a vertical cross sectional view with a photomask mounted thereon for the dust particle-capturing test (see Example 1) in which the transparent polymeric film 1 is flatly supported by a frame member 3 by being adhesively bonded thereto with an intervening layer 4 of an adhesive. The surface of the polymeric film 1 facing inwardly or, namely, the surface to face the photomask, which is formed from a transparent substrate 5 and the pattern 6 borne by the substrate 5, mounted on the frame-supported pellicle at the surface of the frame member 3, is coated with a coating layer 2 of the specific organopolysiloxane-based adhesive composition which may capture dust particles. It is a convenient, though not essential, way to coat the other surface of the frame member 3 with a pressure-sensitive adhesive, which can be the same as or different from that used for the adhesive coating layer 2 on the inner surface of the polymeric film 1, to form an adhesive layer 7 to facilitate mounting of the photomask on the pellicle. The adhesive layer 7 can temporarily be prevented from inadvertent sticking in handling by applying a sheet of release paper which is removed directly before the frame-supported pellicle is mounted on a photomask.

The polymeric material for the transparent film in the inventive frame-supported pellicle is not particularly limitative including the most conventional polymers of certain cellulose derivatives such as nitrocelluloses and cellulose acetates. These cellulose derivatives, however, are not quite satisfactory because, in addition to the relatively strong absorption band in the short-wavelength region of 210 to 500 nm, the stability thereof is rather poor to cause yellowing when the pellicle is used prolongedly under ultraviolet light so that the pellicle prepared from these cellulose derivatives cannot be used in the extremely fine photolithographic patterning works in the manufacture of, for example, VLSIs and high-density liquid crystal display units in which the light for patterning has a short wavelength of 210 to 500 nm as the ultraviolet light of so-called i-line and g-line or the light beams emitted from an excimer laser.

Alternatively, the polymeric material of the transparent film in the inventive pellicle can be a polymer of vinyl trimethyl silane disclosed in Japanese Patent Kokai 2-230245 as well as a pullulan compound, an amorphous fluocorcarbon polymer or a silicone-modified polyvinyl alcohol previously proposed by some of the inventors by which the above mentioned disadvantages are greatly mitigated. It is optional that the polymeric film of the pellicle can be provided with a transparent electroconductive film or rendered hydrophilic by a suitable treatment on the surface so as to decrease accumulation of static electric charge which is responsible for attraction of dust particles. It is further optional that a low-reflectance coating layer is formed on the surface of the polymeric film opposite to the photomask when the frame-supported pellicle is mounted on the photomask in order to increase light transmission therethrough.

The thickness of the transparent polymeric film in the inventive pellicle can be conventional and is not particularly limitative in the range, for example, from 0.5 to 10 µm or, preferably, from 0.8 to 5 µm since the film would be poor in the mechanical strengths when the thickness thereof is too small while, when the thickness is too large, the transmissivity of light therethrough would be disadvantageously decreased. A film having such a thickness can be prepared, for example, by the method of casting, in which a solution of the polymer in an organic solvent having a concentration of 3 to 10% by weight is spread over a flat and horizontal surface of a substrate such as a glass plate and the solvent in the solution is removed by evaporation to form a dry film which is then peeled from the substrate surface. The polymeric film should desirably have transmissivity of light of at least 95% or, preferably, at least 98% from the standpoint of practical use. When the polymeric film has a relatively large thickness of 5 µm or larger in view of the requirement for high mechanical strengths, the transmissivity of light of 90% or larger in the wavelength region of 210 to 500 nm would be acceptable in most applications.

The material of the frame member, by which the above described transparent polymeric film is flatly supported by adhesive bonding, is not particularly limitative including, for example, aluminum and aluminum alloys. The dimensions of the frame member, which can be circular or square, should be adequately selected to accord with the photomask to be protected by the frame-supported pellicle. The transparent polymeric film and the frame member are bonded in a crease-free fashion by using a suitable adhesive such as epoxy resin-based ones.

As is stated before, the transparent polymeric film supported by the frame member is coated, on the surface to face the photomask when the frame-supported pellicle is mounted on the photomask, with a specific organopolysiloxane-based adhesive composition defined before. The essential ingredients in the organopolysiloxane-based adhesive composition include the component (A), which is a so-called MQ silicone resin, and the component (B), which is a diorganopolysiloxane having a linear molecular structure represented by the above given general formula (I). The MQ resin as the component (A) consists of monofunctional siloxane units expressed by the unit formula $(CH_3)_3SiO_{0.5}$ and tetravalent siloxane units expressed by the unit formula $SiO_2$ in a molar ratio in the range from 1:0.4 to 1:1.5 or, preferably, from 1:0.7 to 1:1. When the molar ratio of the two types of the siloxane units is outside of this range, the adhesiveness of the adhesive composition would be decreased.

The component (B) of the adhesive composition is a diorganopolysiloxane having a linear molecular structure as expressed by the general formula (I) given above, in which $R^1$ is a hydroxy group, methyl group or vinyl group, $R^2$ is a methyl group or vinyl group, x is a positive integer, preferably, in the range from 100 to 10,000 and y is 0 or a positive integer, preferably, not exceeding 9900 with the proviso that x+y is in the range from 100 to 10,000. The diorganopolysiloxane has a viscosity of an oil or a gum-like consistency depending on the value of x+y. When the value of x+y is too small or too large, the sticky adhesiveness of the composition would be decreased.

The organopolysiloxane-based adhesive composition used in the inventive pellicle is prepared by merely blending 100 parts by weight of the above described MQ resin as the component (A) and from 20 to 50 parts by weight of the diorganopolysiloxane as the component (B), optionally, by diluting with a suitable organic solvent such as toluene and xylene. It is optional that the mixture of the components (A) and (B) is subjected to the reaction of dehydration condensation between the silanolic hydroxy groups either partially or completely so as to further improve the adhesiveness of the adhesive composition. The condensation reaction proceeds at a temperature in the range from room temperature to 200° C. or, when an organic solvent is used, from room temperature to the boiling point of the solvent and the reation is complete usually within 30 minutes to 30 hours under agitation of the mixture either in the absence or in the presence of a condensation catalyst. The adhesive composition can be admixed according to need with a crosslinking agent, curing catalyst and other known additives each in a limited amount.

The transparent polymeric film in the inventive frame-supported pellicle is coated with the above described organopolysiloxane-based adhesive composition on the surface to face the photomask when the pellicle is mounted on a photomask at the lower end of the frame member. It is optional that, in addition to the surface of the polymeric film, the inwardly facing surface of the frame member is also coated with the same adhesive composition. The coating thickness of the adhesive layer is preferably in the range from 0.1 to 1.0 µm as dried. A convenient way to prepare the inventive frame-supported pellicle is that a film of the polymeric material, which is still in an as-prepared state by the casting method on a substrate surface, is coated on the exposed surface with the adhesive composition and then a frame member is adhesively bonded to the thus coated surface of the polymeric film by using a suitable curable adhesive such as epoxy resin-based ones followed by peeling of the polymeric film from the substrate surface. This peeling procedure can be facilitated by conducting the procedure in water.

In the following, the frame-supported pellicle of the invention is illustrated in more detail by way of examples and comparative examples as preceded by a description of the preparation procedure of the specific organopolysiloxane-bassed adhesive compositions.

Synthetic Preparation 1.

Into a flask of 1000 ml capacity equipped with a stirrer, thermometer, gas inlet tube and cooling tube having a discharge port of the condensate were introduced 40 g of a MQ resin consisting of the monofunctional siloxane units expressed by the unit formula $(CH_3)_3SiO_{0.5}$ and tetravalent siloxane units expressed by the unit formula $SiO_2$ in a molar ratio of 1:1.2, 12 g of a dimethylpolysiloxane having an average number of the silicon atoms of 202 in a molecule and terminated at each molecular chain end with a dimethyl hydroxy silyl group and 400 g of xylene to form a reaction mixture which was heated at 140° C. under reflux of the solvent for 3 hours with agitation under an atmosphere of nitrogen gas while the distillate of water formed by the condensation reaction was periodically discharged out of the discharge port of the cooling tube. After completion of the reaction in this manner, the reaction mixture was cooled to room temperature to give a viscous solution having a viscosity of 6000 centistokes at 25° C. and containing 11.5% by weight of non-volatile matter. This adhesive solution is called the adhesive I hereinafter.

Synthetic Preparation 2.

Into the same flask of 1000 ml capacity as used in Synthetic Preparation 1 were introduced 50 g of a MQ resin consisting of the monofunctional siloxane units expressed by the unit formula $(CH_3)_3SiO_{0.5}$ and tetravalent siloxane units expressed by the unit formula $SiO_2$ in a molar ratio of 1:1, 25 g of a diorganopolysiloxane having a gum-like consistency and expressed by the average structural formula

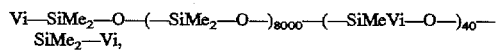

in which Me is a methyl group and Vi is a vinyl group, and 500 g of xylene to form a reaction mixture which was heated at 140° C. under reflux of the solvent for 3 hours with agitation in an atmosphere of nitrogen gas while the distillate of water formed by the condensation reaction was periodically discharged out of the discharge port of the cooling tube. After completion of the reaction in this manner, the reaction mixture was cooled to room temperature to give a viscous solution having a viscosity of 1200 centistokes at 25° C. and containing 30% by weight of non-volatile matter. This adhesive solution is called the adhesive II hereinafter.

Example 1.

A polymer of vinyl trimethyl silane having an intrinsic viscosity of 0.95 dl/g as measured in toluene at 20° C. was dissolved in toluene in a concentration of 3% by weight and the polymer solution was spread over a flat and smooth glass plate by using a spinner in a thickness of 1.0 µm as dried followed by evaporation of the solvent to form a dry polymer film on the glass plate. This polymeric film on the glass plate was coated with the adhesive I by using a spinner in a coating thickness of 0.3 µm as dried followed by drying first at 80° C. for 2 hours and then at 100° C. for 1 hour.

An annular frame of aluminum having an inner diameter of 130 mm, outer diameter of 140 mm and thickness of 2 mm was coated on one surface with an epoxy-based adhesive (Araldite Rapid, a product by Showa Kobunshi Co.) and put on the above prepared polymeric film still on the glass plate so that they were adhesively bonded together by standing for 1 hour at room temperature. When the assembly of the polymeric film on the glass plate and the aluminum frame was kept in water for 5 minutes, spontaneous peeling took place between the glass plate and the polymeric film which was taken out of water and trimmed by clipping the portions projecting out of the aluminum frame to give a frame-supported pellicle with the polymeric film flatly supported by the aluminum frame.

The thus prepared frame-supported pellicle was subjected to the measurement of the transmissivity of light to find a value of 90% or larger over the wavelength range of 240 to 500 nm. Namely, the light transmissivity of the pellicle was 98.4% for the g-line at a wavelength of 436 nm, 98.2% for the i-line at a wavelength of 365 nm, 98.1% for the excimer laser beam at a wavelength of 249 nm and 90% for the light at a wavelength of 210 nm after the polymeric film was provided on both surfaces with a low-reflectance coating layer. Absolutely no yellowing of the polymeric film was found even after irradiation of the film for 1500 hours with the excimer laser beam of 200 watts/cm² intensity showing excellent stability against ultraviolet irradiation.

A photomask kept in a clean room of class 100 cleanness was mounted on the aluminum frame of the pelicle as is shown in the FIGURE of the accompanying drawing and they were subjected to 50 times of vibration by using a vibrator. The pellicle demounted from the photomask was visually inspected to count the number of dust particles captured on the adhesive layer. The number of the dust particles was 0.2 per cm² as an average over the whole surface area.

Example 2.

A fluorine-containing polymer (Teflon AF 1600, a product by DuPont Co.), which was a copolymer of tetrafluoroethylene and a fluorine-containing monomer having a cyclic perfluoroether group, was dissolved in a fluorine-containing solvent mainly composed of perfluoro(2-butyl tetrahydrofuran) (Florinert FC-75, a product by Minnesota Mining and Mnufacturing Co.) to give a polymer solution in a concentration of 8.0% by weight. The polymer solution was spread over a well-polished plate of fused quartz glass having a diameter of 200 mm and a thickness of 3 mm by using a spinner to form a transparent polymer film having a thickness of 1.21 µm after drying. This polymer film on the fused quartz glass plate was coated with the adhesive II with admixture of 0.5 part by weight of benzoyl peroxide per 100 parts by weight of the solid matter therein by using a spinner in a coating thickness of 0.2 µm as dried followed by drying at 120° C. for 2 hours. The polymer film coated with the adhesive II was adhesively bonded to a squae frame of aluminum having an inner side length of 100 mm, outer side length of 140 mm and thickness of 2 mm in the same manner as in Example 1 followed by peeling of the polymeric film from the fused quartz glass plate in water. The polymeric film thus supported by the aluminum frame was heated at 160° C. for 1 hour and then trimmed by clipping the portions projecting out of the frame to prepare a frame-supported pellicle.

The thus prepared frame-supported pellicle was subjected to the measurement of the transimissivity of light through the film to find a value of 97.5% for each of the excimer laser beam, i-line light and g-line light. Further, the pellicle film was irradiated for 4500 hours with i-line light in an intensity of 90 watts/cm$^2$ or for 2000 hours with the excimer laser beam in an intensity of 200 watts/cm$^2$ to find absolutely no changes in the appearance and in the transmissivity to the i-line light. Further, dust particle-capturing test was undertaken in the same manner as in Example 1 to find that the number of the dust particles captured on the adhesive surface was 0.3 per cm$^2$ as an average for the whole surface area.

Comparative Examples 1 to 3.

The experimental procedure in each of these comparative examples was substantially the same as in Example 1 except that the polymeric film of the pellicle was formed from a nitrocellulose in Comparative Example 1, the polymeric film was formed from a nitrocellulose and coated with an acrylic-modified fluorine-containing adhesive polymer in Comparative Example 2 and the polymeric film formed from the same polymer of vinyl trimethyl silane as in Example 1 was coated with an acrylic-modified silicone resin adhesive in Comparative Example 3.

The transmissivity of these adhesive-coated pellicle films was 45.6%, 40.3% and 97.5%, respectively, to the excimer laser beam of 249 nm wavelength. The dust particle capturing test undertaken with these pellicles in the same manner as in Example 1 gave numbers of the captured dust particles of 0.2, 0.03 and 0.05, respectively, per cm$^2$ area as an average for the whole surface area. In the irradiation test with the excimer laser beam conducted in the same manner as in Example 1, the nitrocellulose-based pellicle films in Comparative Examples 1 and 2 were found very brittle and fragile after only 15 hours of irradiation and the adhesive coating layer in Comparative Example 3 became brittle by the irradiation for 200 hours.

What is claimed is:

1. A frame-supported pellicle for dust-proofing of a photolithographic mask which comprises:

(a) a frame member;

(b) a transparent film of a polymeric material flatly supported by the frame member by adhesive bonding; and (c) a layer of a sticky adhesive on one of the surfaces of the transparent film of a polymeric material, the sticky adhesive being an organopolysiloxone composition comprising:

(A) 100 parts by weight of an organopolysiloxane resin consisting of monofunctional siloxane units expressed by the unit formula $(CH_3)_3SiO_{0.5}$ and tetravalent siloxane units expressed by the unit formula $SiO_2$ in a molar ratio in the range from 1:0.4 to 1:1.5; and (B) from 20 to 50 parts by weight of a diorganopolysiloxane represented by the general formula

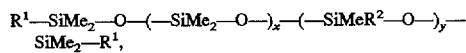

in which Me is a methyl group, $R^1$ is a hydroxy group, methyl group or vinyl group, $R^2$ is a methyl group or vinyl group, x is a positive integer and y is 0 or a positive integer with the proviso that x+y is in the range from 100 to 10,000; or a partial or complete condensation product thereof.

2. The frame-supported pellicle for dust-proofing of a photolithographic mask as claimed in claim 1 in which the transparent film of a polymeric material has a thickness in the range from 0.5 to 10 µm.

3. The frame-supported pellicle for dust-proofing of a photolithographic mask as claimed in claim 1 in which the layer of a sticky adhesive has a thickness in the range from 0.1 to 1.0 µm.

4. The flame-supported pellicle for dust-proofing of a photolithographic mask as claimed in claim 1 in which the molar ratio of the monofunctional siloxane units expressed by the unit formula $(CH_3)_3SiO_{0.5}$ and the tetravalent siloxane units expressed by the unit formula $SiO_2$ is in the range from 1:0.7 to 1:1.

* * * * *